United States Patent
Bal et al.

(10) Patent No.: US 10,218,380 B1
(45) Date of Patent: Feb. 26, 2019

(54) HIGH SPEED DATA WEIGHTED AVERAGING ARCHITECTURE

(71) Applicant: STMicroelectronics International N.V., Sch (NL)

(72) Inventors: Ankur Bal, Greater Noida (IN); Rupesh Singh, Ghaziabad (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 16/036,004

(22) Filed: Jul. 16, 2018

Related U.S. Application Data

(63) Continuation-in-part of application No. 15/864,233, filed on Jan. 8, 2018, now Pat. No. 10,050,640.

(51) Int. Cl.
 *H03M 7/00*  (2006.01)
 *H03M 7/34*  (2006.01)
 *H03M 7/16*  (2006.01)
 *H03K 19/20*  (2006.01)

(52) U.S. Cl.
 CPC .......... *H03M 7/165* (2013.01); *H03K 19/20* (2013.01)

(58) Field of Classification Search
 CPC ........ H03M 7/165; H03M 1/66; H03M 3/468; H03M 7/16; H03M 9/00
 USPC ..................................................... 341/50, 51
 See application file for complete search history.

(56) References Cited

U.S. PATENT DOCUMENTS

| | | | |
|---|---|---|---|
| 4,852,083 A | 7/1989 | Niehaus et al. |
| 6,208,667 B1 | 3/2001 | Caldara et al. |
| 7,561,088 B1 | 7/2009 | Ferguson |
| 7,822,909 B2 | 10/2010 | Brunot |
| 8,736,476 B2 | 5/2014 | Gong et al. |
| 9,337,874 B1 | 5/2016 | Yu et al. |
| 2007/0040720 A1 | 2/2007 | Kim |
| 2009/0110102 A1 | 4/2009 | Hong et al. |
| 2010/0211719 A1 | 8/2010 | Satpathy et al. |

OTHER PUBLICATIONS

Dayanik, et al. "A 5GS/s 156MHz BW 70dB DR Continuous-Time Sigma-Delta Modulator with Time-Interleaved Reference Data-Weighted Averaging," 2017 Symposium on VLI Circuits, 2017 (pp. C38-C39).

Da-Huei Lee, Ching-Chung Li, Tai-Haur Kuo, "High-speed Low-Complexity Implementation for Data Weighted Averaging Algorithm," IEEE 2002, pp. 283-286.

*Primary Examiner* — Jean B Jeanglaude
(74) *Attorney, Agent, or Firm* — Crowe & Dunlevy

(57) ABSTRACT

Data weighted averaging of a thermometric coded input signal is accomplished by controlling the operation of a crossbar switch matrix to generate a current cycle of a data weighted averaging output signal using a control signal generated in response to feedback of a previous cycle of the data weighted averaging output signal. The control signal specifies a bit location for a beginning logic transition of the data weighted averaging output signal in the current cycle based on detection of an ending logic transition of the data weighted averaging output signal in the previous cycle.

17 Claims, 5 Drawing Sheets

HIGH SPEED DATA WEIGHTED AVERAGING ARCHITECTURE

CROSS REFERENCE TO RELATED APPLICATION

This application is a continuation-in-part of U.S. application for patent Ser. No. 15/864,233, filed Jan. 8, 2018, the disclosure of which is incorporated by reference.

TECHNICAL FIELD

This disclosure is related to the field of signal processing and, in particular, to a data weighted averaging architecture.

BACKGROUND

It is common for a high speed data converter to employ a data weighted averaging (DWA) algorithm as a solution to achieve dynamic element matching (DEM). FIG. 1 illustrates a comparison of the operation of a data converter 102 that does not employ DWA and a data converter 104 that does employ DWA. A data word 110 is received and processed by the converter circuit to actuate the output elements (OE) of a digital to analog converter (DAC). In this example, the DAC includes seven output elements.

For the data converter 102, the data word 110 is decoded by a thermometer decoder 120 to generate a control signal 122 whose data bits selectively actuate the output elements 124. If the data word has a value of 3 (binary format <0,1,1>), the thermometer decoder 120 decodes that word to generate a seven bit control signal 122 having a value of <1,1,1,0,0,0,0> which causes the first three output elements 124 from the left side to be actuated. Shaded boxes indicate an output element that is activated, while the non-shaded boxes indicate an output element that is deactivated. If the next data word has a value of 1 (binary format <0,0,1>), the thermometer decoder 120 decodes that word to generate a seven bit control signal 122 having a value of <1,0,0,0,0,0,0> which causes the only the first output element 124 from the left side to be actuated. The operation for the next data words with values of 5 and 4 are also shown.

It will be noted that this data converter 102 disproportionately actuates the output elements 124. In other words, the output elements on the left side of the DAC will be actuated more frequently than the output elements on the right side of the DAC. This will not be a problem in an ideal scenario when all output elements 124 of the DAC are identical. However, in practical designs, such a mismatch exists and manifests at the output as an increase in the noise floor of the output signal. This negatively impacts the performance of the DAC and results in a reduced signal to noise ratio. The DWA algorithm ensures that the mismatch across the unary output elements 124 is high-passed and pushed out beyond the band of interest. This is akin to first order noise shaping.

For the data converter 104, the data word 110 is processed by a dynamic element matching (DEM) circuit 130 implementing a data weighted averaging (DWA) algorithm to generate a control signal 132 whose data bits selectively actuate the output elements (OE) 134. If the data word has a value of 3 (binary format <0,1,1>), the DEM 130 decodes that word to generate a seven bit control signal 122 having a value of <1,1,1,0,0,0,0> which causes the first three output elements 124 from the left side to be actuated. Shaded boxes indicate an output element that is activated, while the non-shaded boxes indicate an output element that is deactivated. At this point, there is no difference in the operation of the data converter 104 compared to the data converter 102. If the next data word has a value of 1 (binary format <0,0,1>), the DEM 130 decodes that word to generate a seven bit control signal 122 having a value of <0,0,0,1,0,0,0> which causes the next sequential one (i.e., only the fourth) output element 124 to be actuated. If the next data word has a value of 5 (binary format <1,0,1>), the DEM 130 decodes that word to generate a seven bit control signal 122 having a value of <1,1,0,0,1,1,1> which causes the next sequential five (i.e., the last three and the first two) output elements 124 to be actuated (in this case necessitating a wraparound from the right side to the left side). The operation for the next data word with a value 4 is also shown which causes actuation of the next sequential four output elements. It will be noted that this data converter 104 over time will relatively equally actuate all of the output elements 134.

Notwithstanding the mismatch that exists with respect to the output elements of the digital to analog converter, the data weighted averaging algorithm causes actuation to be spread relatively equally over all of the output elements. The noise due to output element mismatch is shaped by the DWA which advantageously averages out the mismatch error in the band of interest.

Circuits to implement a high speed data converter that employ a data weighted averaging algorithm to achieve dynamic element matching are well known in the art. An example of such a circuit is show in FIG. 2 which illustrates a block diagram of a continuous time sigma-delta modulator using a time interleaved reference DWA architecture. The configuration and operation of the FIG. 2 circuit will not be discussed herein as such information may be obtained by reference to Dayanik, et al., "A 5GS/s 156 MHz BW 70 dB DR Continuous-Time Sigma-Delta Modulator with Time-Interleaved Reference Data-Weighted Averaging," 2017 Symposium on VLI Circuits, 2017 (incorporated by reference). Concerns with this solution, and other similar solutions known in the prior art, include: operation is cumbersome due to a high conversion time which limits throughput and performance; the circuit is area and power inefficient; and the use of interleaving introduces high level of complexity. The complexity is further illustrated by the need for decoder and adder logic to perform dynamic indexing functions. Performance of the circuit is also adversely affected by the use of multiple parallel paths for interleaving.

There is accordingly a need in the art for a high speed data converter that operates with a low computational delay and is area and power efficient. The needed circuit should preferably avoid use of a complex decoder and adder circuit and avoid use of interleaved structures.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In an embodiment, a circuit for generating a data weighted averaging signal from a thermometric code signal comprises: a crossbar switch matrix having an input configured to receive the thermometric code signal and an output configured to output the data weighted averaging signal, wherein switching between the input and output by the crossbar switch matrix is controlled by a crossbar selection signal; and a control circuit configured to receive a previous time cycle of the data weighted averaging signal and determine from bits of the previous time cycle of the data weighted averaging signal a bit location within the previous time cycle of the data weighted averaging signal where an ending logic transition occurs and generate the crossbar selection signal to control switching between the input and output by the crossbar switch matrix to select a bit location within a current time cycle of the data weighted averaging signal where a beginning logic transition occurs.

In an embodiment, a circuit comprises: an input data bus carrying a multi-bit input data word in thermometer coded format; a crossbar switch matrix having switch inputs coupled to the input data bus to receive the multi-bit input data word and switch outputs configured to output a multi-bit output data word that is a data weighted averaging (DWA) conversion of the thermometer coded multi-bit input data word; and a DWA control circuit configured to receive the multi-bit output data word and generate from the multi-bit output data word a multi-bit selection signal that is applied by a selection data bus to control inputs of the crossbar switch matrix; wherein the crossbar switch matrix is configured to operate in response to the multi-bit selection signal to selectively map the switch inputs to the switch outputs to effectuate the DWA conversion of the thermometer coded multi-bit input data word to output the multi-bit output data word.

In an embodiment, a circuit for generating a data weighted averaging signal from a thermometric code signal comprises: a crossbar switch matrix having an input configured to receive the thermometric code signal and an output configured to output the data weighted averaging signal, wherein switching between the input and output by the crossbar switch matrix is controlled by a crossbar selection signal; and a data weighted averaging control circuit configured to generate the crossbar selection signal. The data weighted averaging control circuit comprises: a first logic circuit configured to determine from bits of the data weighted averaging signal a bit location where an ending logic transition occurs; a load circuit configured to selectively load the bit location as the crossbar selection signal in response to assertion of a load signal; and a load control circuit configured to inhibit assertion of the load signal if all bits of the thermometric code signal are either logic 0 or logic 1.

In an embodiment, a method comprises: converting a thermometric code signal to a data weighted averaging signal using a crossbar switch matrix controlled by a crossbar selection signal; determining from bits of the data weighted averaging signal an ending bit location in the data weighted averaging signal where an ending logic transition occurs; selectively loading the bit location as the crossbar selection signal in response to assertion of a load signal; and inhibiting assertion of the load signal if all bits of the thermometric code signal are either logic 0 or logic 1.

DETAILED DESCRIPTION

In the following detailed description and the attached drawings, specific details are set forth to provide a thorough understanding of the present disclosure. However, those skilled in the art will appreciate that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

Figure 3:
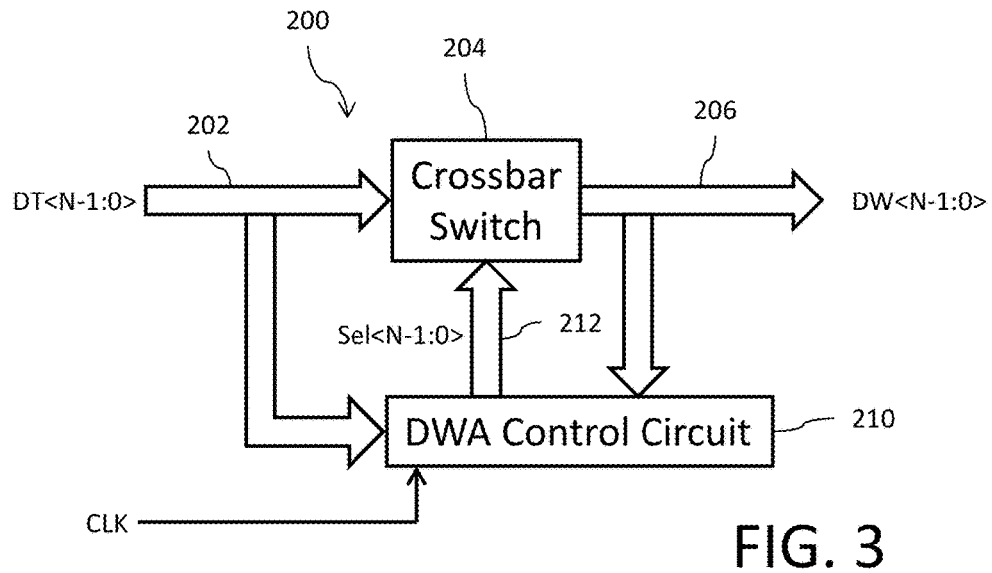
FIG. 3 is a block diagram of a DWA circuit in accordance with an embodiment.

Reference is now made to FIG. 3 showing a block diagram of a data weighted averaging (DWA) circuit 200. The circuit includes a data bus 202 that carries multi-bit input data words DT<N−1:0> in a thermometer coded format. In an example, N=16; however, it will be understood that the solution disclosed herein is scalable for any value of N. The data bus 202 is connected to the data inputs of a crossbar switch matrix 204. The outputs of the crossbar switch matrix 204 are connected to a data bus 206 that carries multi-bit output data words DW<N−1:0> that are data weighted averaging conversions of the thermometer coded multi-bit input data words DT<N−1:0>. A DWA control circuit 210 receives both the multi-bit input data words DT<N−1:0> and the multi-bit output data words DW<N−1:0>, as well as a data clock signal (CLK), and operates to generate a multi-bit selection signal Sel<N−1:0> that is applied by a data bus 212 to the control inputs of the crossbar switch matrix 204. The crossbar switch 204 operates in response to the multi-bit selection signal Sel<N−1:0> to selectively map switch inputs to switch outputs to effectuate the data weighted averaging conversion and achieve dynamic element matching (DEM).

The physical configuration of a crossbar switch matrix 204 is well known to those skilled in the art. The crossbar switch matrix 204 effectively includes a plurality of switch elements that can be controlled to selectively couple a given one of the switch inputs to a given one of the switch outputs. The complexity of the switch element circuitry permits any individual one of the switch inputs to be connected to any given one of the switch outputs in response to the data value of the multi-bit selection signal Sel<N−1:0>.

Figure 4:
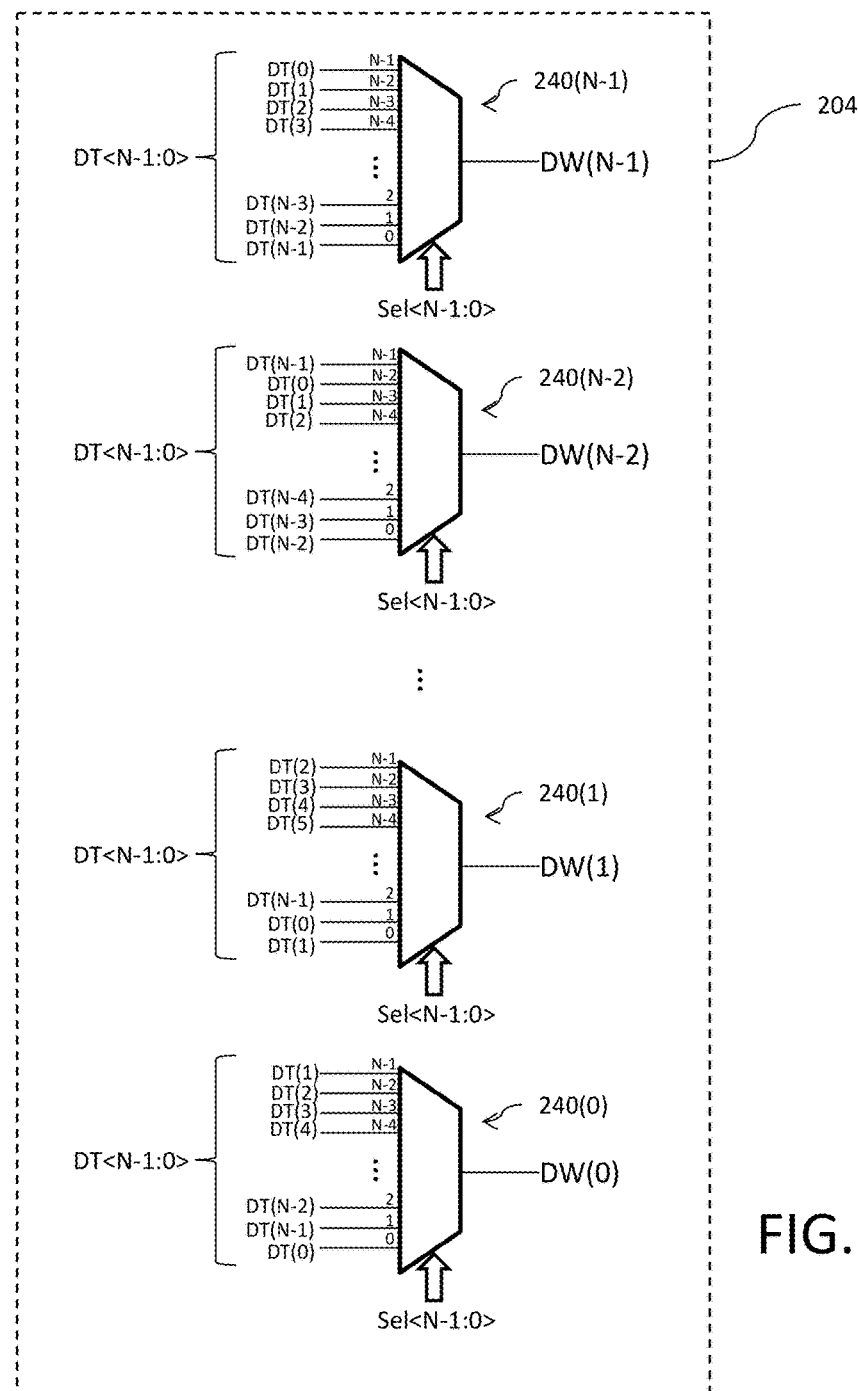
FIG. 4 is a logical representation using multiplexers of a crossbar switch as used in the DWA circuit of FIG. 3.

The operation of the crossbar switch matrix 204 may be logically represented by N multiplexers 240(0) to 240(N−1), wherein each multiplexer 240 is an N:1 multiplexer. See, FIG. 4. The bits of the multi-bit input data word DT<N−1:0> on data bus 202 are identified as DT(N−1), . . . , DT(0). The bits of the multi-bit output data words DW<N−1:0> as identified as DW(N−1), . . . , DW(0). The selection control input of each multiplexer 240 receives multi-bit selection signal Sel<N−1:0>. It will be noted that the wrap around sequence order for the bits of the multi-bit input data word DT<N−1:0> at the inputs of each multiplexer is different. As an example, for multiplexer 240(N−1), the order of the bits of the multi-bit input data word DT<N−1:0> at the input is DT(N−1), DT(N−2), . . . , DT(0). For multiplexer 240(N−2), the order of the bits of the multi-bit input data word DT<N−1:0> at the input is DT(N−2), DT(N−3), . . . , DT(0), DT(N−1). For multiplexer 240(1), the order of the bits of the multi-bit input data word DT<N−1:0> at the input is DT(1), DT(0), DT(N−1), . . . , DT(3), DT(2). For multiplexer 240(0), the order of the bits of the multi-bit input data word DT<N−1:0> at the input is DT(0), DT(N−1), DT(N−2), . . . , DT(2), DT(1). Those skilled in the art will recognize that the connection of the sequence of bits of the multi-bit input data word DT<N−1:0> is effectively barrel-shifted across the N multiplexers 240(0) to 240(N−1). The effect of this is that the crossbar switch matrix operates to selectively connect bits of the multi-bit input data word DT<N−1:0> to bits of the multi-bit output data words DW<N−1:0> with a selectable barrel shift position selected by the value of the multi-bit selection signal Sel<N−1:0>.

The DWA control circuit 210 generates the multi-bit selection signal Sel<N−1:0> in a manner such that only one bit of the N bits in the selection signal can be asserted (for example, at logic 1) at a time, while all other bits are deasserted (for example, at logic 0). The N multiplexers 240(0) to 240(N−1) respond to the asserted bit of the multi-bit selection signal Sel<N−1:0> by selectively connecting the multiplexer input (reference numbers 0 to N−1) which corresponds to the asserted bit to the multiplexer output. The single asserted bit of the multi-bit selection signal Sel<N−1:0> specifies the barrel-shifted positional relationship between the sequence of bits of the multi-bit input data word DT<N−1:0> and the sequence of bits of the multi-bit output data words DW<N−1:0>. This may be better understood by reference to some examples.

Consider first the multi-bit selection signal Sel<N−1:0> with the value of <0, 0, . . . , 0, 1>, where only Sel(0)=1. In response to this value of the multi-bit selection signal Sel<N−1:0>, multiplexer 240(0) will connect DT(0) to the output DW(0), multiplexer 240(1) will connect DT(1) to the output DW(1), multiplexer 240(N−2) will connect DT(N−2) to the output DW(N−2), and multiplexer 240(N−1) will connect DT(N−1) to the output DW(N−1).

Consider now the multi-bit selection signal Sel<N−1:0> with the value of <0, 0, . . . , 1, 0>, where only Sel(1)=1. In response to this value of the multi-bit selection signal Sel<N−1:0>, multiplexer 240(0) will connect DT(N−1) to the output DW(0), multiplexer 240(1) will connect DT(0) to the output DW(1), multiplexer 240(N−2) will connect DT(N−3) to the output DW(N−2), and multiplexer 240(N−1) will connect DT(N−2) to the output DW(N−1).

For the multi-bit selection signal Sel<N−1:0> with the value of <0,1, . . . ,0,0>, where only Sel(N−2)=1. In response to this value of the multi-bit selection signal Sel<N−1:0>, multiplexer 240(0) will connect DT(2) to the output DW(0), multiplexer 240(1) will connect DT(3) to the output DW(1), multiplexer 240(N−2) will connect DT(0) to the output DW(N−2), and multiplexer 240(N−1) will connect DT(1) to the output DW(N−1).

Lastly, if the multi-bit selection signal Sel<N−1:0> has the value of <1,0, . . . ,0,0>, where only Sel(N−1)=1. In response to this value of the multi-bit selection signal Sel<N−1:0>, multiplexer 240(0) will connect DT(1) to the output DW(0), multiplexer 240(1) will connect DT(2) to the output DW(1), multiplexer 240(N−2) will connect DT(N−1) to the output DW(N−2), and multiplexer 240(N−1) will connect DT(0) to the output DW(N−1).

The operation of the crossbar switch matrix 204 for connecting bits of the multi-bit input data words DT<N−1:0> to bits of the multi-bit output data words DW<N−1:0> may be mathematically represented by the following operation:

$$DW(n,k)=DT(\mathrm{mod}(N+n-k,N))$$

wherein n, k∈(0,N−1), n is the output, and k is the selection such that DW(n,k) is the switch address connecting input DT((N+n−k)modulo N) to output DW(n).

Consider the first example given above where the multi-bit selection signal Sel<N−1:0> has the value of <0,0, . . . ,0,1>, where only Sel(0)=1 and thus k=0. For n=0 and N=16, the output bit DW(0) will be connected to the input bit DT(0) because (16+0−0/16=1 remainder 0 and thus the modulus is 0). For n=1 and N=16, the output bit DW(1) will be connected to the input bit DT(1) because (16+1−0/16=1 remainder 1 and thus the modulus is 1). The foregoing corresponds to the result noted above where multiplexer 240(0) will connect DT(0) to the output DW(0), multiplexer 240(1) will connect DT(1) to the output DW(1), multiplexer 240(N−2) will connect DT(N−2) to the output DW(N−2), and multiplexer 240(N−1) will connect DT(N−1) to the output DW(N−1). In this configuration, the consecutive bits DT(0) to DT(N−1) of the multi-bit input data word DT<N−1:0> are mapped by the crossbar switch matrix 204 for k=0 to bits DW(1), DW(2), . . . , DW(0), respectively, of the multi-bit output data word DW<N−1:0>.

Consider now the multi-bit selection signal Sel<N−1:0> having the value of <0,0, . . . ,1,0>, where only Sel(1)=1 and thus k=1. For n=0 and N=16, the output bit DW(0) will be connected to the input bit DT(15) because (16+0−1/16=0 remainder 15 and thus the modulus is 15). For n=1 and N=16, the output bit DW(1) will be connected to the input bit DT(1) because (16+1−1/16=1 remainder 0 and thus the modulus is 0). The foregoing corresponds to the result noted above where multiplexer 240(0) will connect DT(N−1) to the output DW(0), multiplexer 240(1) will connect DT(0) to the output DW(1), multiplexer 240(N−2) will connect DT(N−3) to the output DW(N−2), and multiplexer 240(N−1) will connect DT(N−2) to the output DW(N−1). In this configuration, the consecutive bits DT(0) to DT(N−1) of the multi-bit input data word DT<N−1:0> are mapped by the crossbar switch matrix 204 for k=1 to bits DW(1), DW(2), . . . , DW(0), respectively, of the multi-bit output data word DW<N−1:0>.

For the multi-bit selection signal Sel<N−1:0> with the value of <0,1, . . . ,0,0>, where only Sel(N−2)=1 and thus k=14. For n=0 and N=16, the output bit DW(0) will be connected to the input bit DT(2) because (16+0−14/16=0 remainder 2 and thus the modulus is 2). For n=1 and N=16, the output bit DW(1) will be connected to the input bit DT(3) because (16+1−14/16=0 remainder 3 and thus the modulus is 3). The foregoing corresponds to the result noted above where multiplexer 240(0) will connect DT(2) to the output DW(0), multiplexer 240(1) will connect DT(3) to the output DW(1), multiplexer 240(N−2) will connect DT(0) to the output DW(N−2), and multiplexer 240(N−1) will connect DT(1) to the output DW(N−1). In this configuration, the consecutive bits DT(0) to DT(N−1) of the multi-bit input data word DT<N−1:0> are mapped by the crossbar switch matrix 204 for k=14 to bits DW(N−2), DW(N−1), . . . , DW(N−3), respectively, of the multi-bit output data word DW<N−1:0>.

Lastly, if the multi-bit selection signal Sel<N−1:0> has the value of <1,0, . . . ,0,0>, where only Sel(N−1)=1 and thus k=15. For n=0 and N=16, the output bit DW(0) will be connected to the input bit DT(1) because (16+0−15/16=0 remainder 1 and thus the modulus is 1). For n=1 and N=16, the output bit DW(1) will be connected to the input bit DT(2) because (16+1−15/16=0 remainder 2 and thus the modulus is 2). The foregoing corresponds to the result noted above where multiplexer 240(0) will connect DT(1) to the output DW(0), multiplexer 240(1) will connect DT(2) to the output DW(1), multiplexer 240(N−2) will connect DT(N−1) to the output DW(N−2), and multiplexer 240(N−1) will connect DT(0) to the output DW(N−1). In this configuration, the consecutive bits DT(0) to DT(N−1) of the multi-bit input data word DT<N−1:0> are mapped by the crossbar switch matrix 204 for k=15 to bits DW(N−1), DW(N−0), . . . , DW(N−2), respectively, of the multi-bit output data word DW<N−1:0>.

Figure 5:
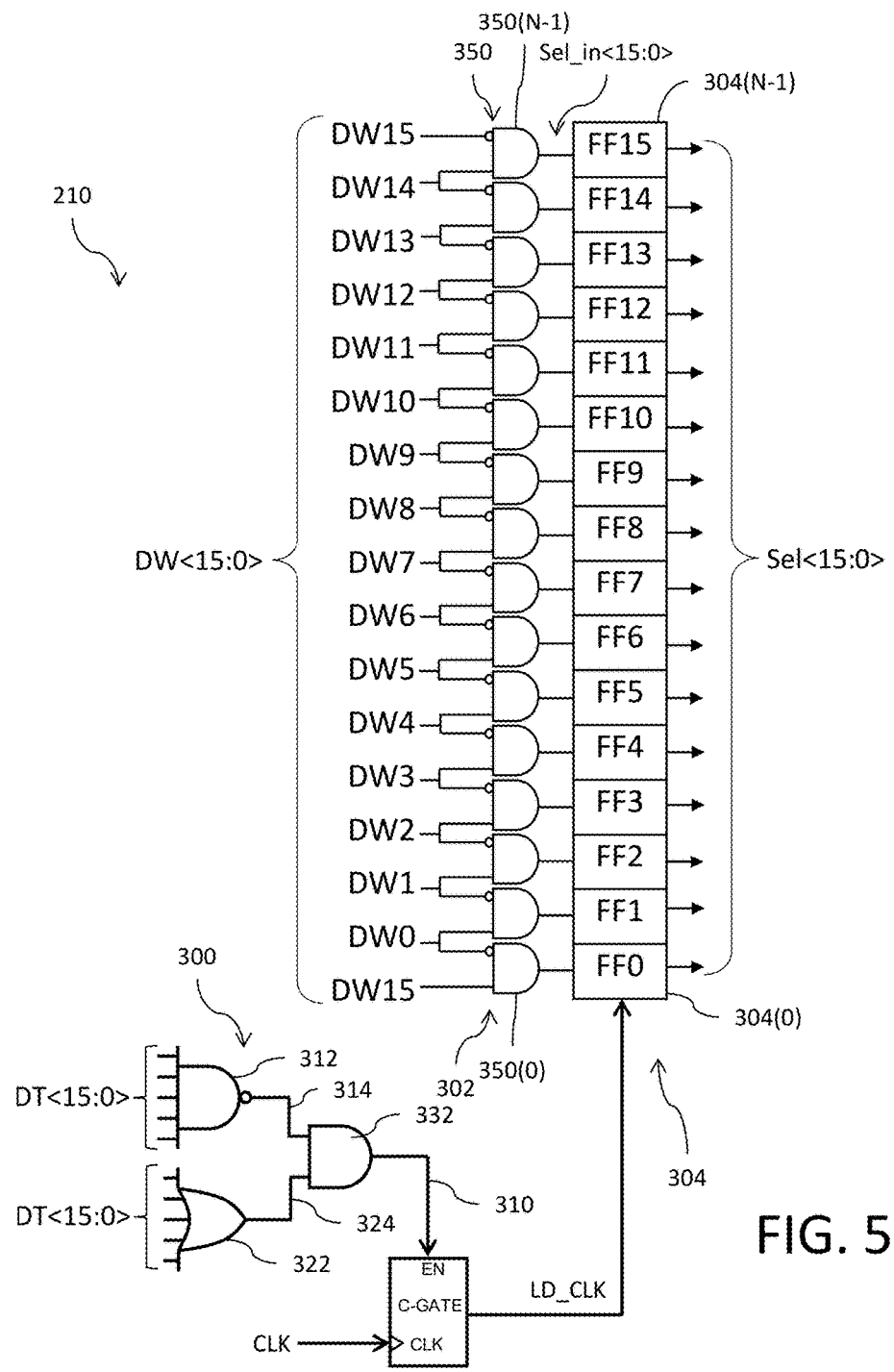
FIG. 5 is a circuit diagram for the DWA control circuit as used in the DWA circuit of FIG. 3.

Reference is now made to FIG. 5 showing a circuit diagram for the DWA control circuit 210. The DWA control circuit 210 includes a clock generation circuit 300, a combinatorial logic circuit 302 and N flip-flops 340(0) to 304(N−1). To conform to the example provided above, N=16 in FIG. 5; however, it will be understood that the solution disclosed herein is scalable for any value of N. The output of each flip-flop 340 corresponds to one bit of the multi-bit selection signal Sel<N−1:0>. All flip-flops 304 operate simultaneously to load a data bit output from the combinatorial logic circuit 302 in response to an edge of a load clock signal LD_CLK and make that loaded data bit available at the flip-flop output for inclusion in the multi-bit selection signal Sel<N−1:0>. The load clock signal LD_CLK is generated by the clock generation circuit 300.

The clock generation circuit 300 includes a clock gate circuit (C-GATE) having a clock input configured to receive a data clock signal CLK and an enable input EN configured to receive an enable signal 310. When the enable signal 310 is asserted, the clock gate circuit operates to pass the data clock signal CLK through as the load clock signal LD_CLK and the flip-flops 340(0) to 304(N−1) will be triggered on the appropriate clock edge to load data bits output from the combinatorial logic circuit 302. Conversely, when the enable signal 310 is deasserted, the clock gate circuit operates to hold the current logic state of the load clock signal LD_CLK and the flip flop operation to load data bits output from the combinatorial logic circuit 302 is paused or inhibited.

The circuit to generate the enable signal 310 includes a logical NAND gate 312 having inputs connected to receive the bits of the multi-bit input data word DT<N−1:0> on data bus 202. The output 314 of the NAND gate 312 is logic 0 when all bits of the multi-bit input data word DT<N−1:0> are logic 1 (and otherwise the output 314 is logic 1). The circuit to generate the enable signal 310 further includes a logical OR gate 322 having inputs connected to receive the bits of the multi-bit input data word DT<N−1:0> on data bus 202. The output 324 of the OR gate 322 is logic 0 when all bits of the multi-bit input data word DT<N−1:0> are logic 0 (and otherwise the output 314 is logic 1). A logical AND gate 332 logically combines the output of NAND gate 312 with the output of OR gate 322 to generate the enable signal 310. The enable signal 310 will accordingly have a logic 0 state only when either the output of NAND gate 312 is logic 0 (indicating detection that all bits of the multi-bit input data word DT<N−1:0> are logic 1) or the output of OR gate 322 is logic 0 (indicating detection that all bits of the multi-bit input data word DT<N−1:0> are logic 0). When the enable signal 310 has the logic 0 state, the clock gate circuit C-GATE is disabled. In all other conditions of the bits of the multi-bit input data word DT<N−1:0>, the enable signal 310 has the logic 1 state, the clock gate circuit C-GATE is enabled.

The combinatorial logic circuit 302 is formed by N logical AND gates 350(0) to 350(N−1) operating to generate a multi-bit input selection signal Sel_in <N−1:0> that is applied to the corresponding inputs of the N flip-flops 340(0) to 304(N−1). A first input of each AND gate 350 is connected to a logical inversion of a corresponding bit of multi-bit output data word DW<N−1:0> received on data bus 206. A second input of each AND gate 350 is connected to an adjacent bit of multi-bit output data word DW<N−1:0> received on data bus 206. For example, AND gate 350(0) has a first input connected to receive the logical inversion of corresponding bit DW(0) and a second input connected to receive adjacent bit DW(N−1), in the example where N=16, this would be bit DW(15). The output of AND gate 350(0) providing one bit of the multi-bit input selection signal Sel_in<N−1:0> is connected to the input of corresponding flip-flop 304(0) for flip-flop FF0. Similarly, AND gate 350(N−1)—in the example where N=16, this would be AND gate 350(15)—has a first input connected to receive the logical inversion of corresponding bit DW(N−1)—in the example where N=16, this would be bit DW(15)—and a second input connected to receive adjacent bit DW(N−2)—in the example where N=16, this would be bit DW(14). The output of AND gate 350(N−1) providing another bit of the multi-bit input selection signal Sel_in<N−1:0> is connected to the input of corresponding flip-flop 304(N−1) for flip-flop FF15. The other AND gates 350 are similarly connected to logically inverted bits and adjacent bits of multi-bit output data word DW<N−1:0> and generate corresponding bits of the multi-bit input selection signal Sel_in<N−1:0>.

The combinatorial logic circuit 302 operates to find the highest significant bit location in the received multi-bit output data word DW<N−1:0> having a logic 1 value. In other words, this is the bit location where an ending logic transition (from logic 1 to logic 0) of multi-bit output data word DW<N−1:0> occurs. The AND gate 350 whose second input receives that logic 1 value from the next adjacent higher bit in the received multi-bit output data word DW<N−1:0> and whose first input receives a logic 0 value will output a logic 1 value. All other AND gates 350 will output a logic low value because at least one of their first or second inputs will receive a logic 0 input. This operation may be better understood by considering the following example where the multi-bit output data word DW<N−1:0> has the value of <0,0, . . . ,0,1,1,1,0>. In this example, it is bit DW(3) that is the highest significant bit having a logic 1 value (the next bit DW(4) has a logic 0 value), and this being the bit location where the ending logic transition occurred. The AND gate 350(4) will have a first input that receives the logical inversion of the bit DW(4) (i.e., receives a logic 1 value at the first input) and have a second input that receives the adjacent bit DW(3) having a logic 1 value. The output of AND gate 350(4) will accordingly be at a logic 1 value, and all other AND gates 350 will output a logic 0 value.

As noted above, AND gate 350(0) has a first input connected to receive the logical inversion of corresponding bit DW(0) and a second input connected to receive adjacent bit DW(N−1). This is important because this connection effectuates a wraparound of the highest significant bit location finding operation. To understand this feature, consider the following example where the multi-bit output data word DW<N−1:0> has the value of <1,1,1, . . . 0,0,0>. In this example, it is bit DW(N−1) that is the highest significant bit having a logic 1 value, and this being the bit location where the ending logic transition occurred. Because of the wraparound, the next adjacent higher bit is bit DW(0) which has a logic 0 value. The AND gate 350(0) will have a first input that receives the logical inversion of the bit DW(0) (i.e., receives a logic 1 value at the first input) and have a second input that receives the adjacent bit DW(N-1) having a logic 1 value. The output of AND gate 350(0) will accordingly be at a logic 1 value, and all other AND gates 350 will output a logic 0 value.

When the edge of the load clock signal LD_CLK is received, the N flip-flops 340(0) to 304(N-1) will load the data output from the corresponding ones of the N logical AND gates 350(0) to 350(N-1). The output from the logical AND gates 350(0) to 350(N-1) forms the bits of the multi-bit selection signal Sel<N-1:0>. Because only one AND gate output will have a logic 1 value at a time, this means that only one bit of the multi-bit selection signal Sel<N-1:0> will have a logic 1 value at a time. This one bit of the multi-bit selection signal Sel<N-1:0> that has the logic 1 value specifies the location (reference k, as described above) for controlling the operation of the crossbar switch matrix 204 to connect bits of the multi-bit input data words DT<N-1:0> to bits of the multi-bit output data words DW<N-1:0> in a particular order. Examples of that operation are discussed in detail above. In effect, the location provided by the multi-bit selection signal Sel<N-1:0> identifies the bit location of the next multi-bit output data word DW<N-1:0> where a beginning logic transition should occur to effectuate data weighted averaging.

As noted above, when the enable signal 310 is logic 0 (i.e., the signal is deasserted), the clock gate circuit operates to hold the current logic state of the load clock signal LD_CLK and the flip-flop operation to load data bits output from the combinatorial logic circuit 302 is paused or inhibited. In this mode, which occurs when all bits of the multi-bit input data word DT<N-1:0> are either logic 1 or logic 0, the LD_CLK inhibits the registers 304 from loading the SEL bits. This is mandatory because the AND logic of the combinatorial logic circuit 302 operating to generate the SEL signal will generate all bits having a logic value for the aforesaid input condition of all logic 1 or all logic 0 for multi-bit input data word DT<N-1:0>. Importantly, as will be discussed herein with respect to circuit operation, this action happens in the previous cycle, thus unburdening the critical timing path.

Figure 6:
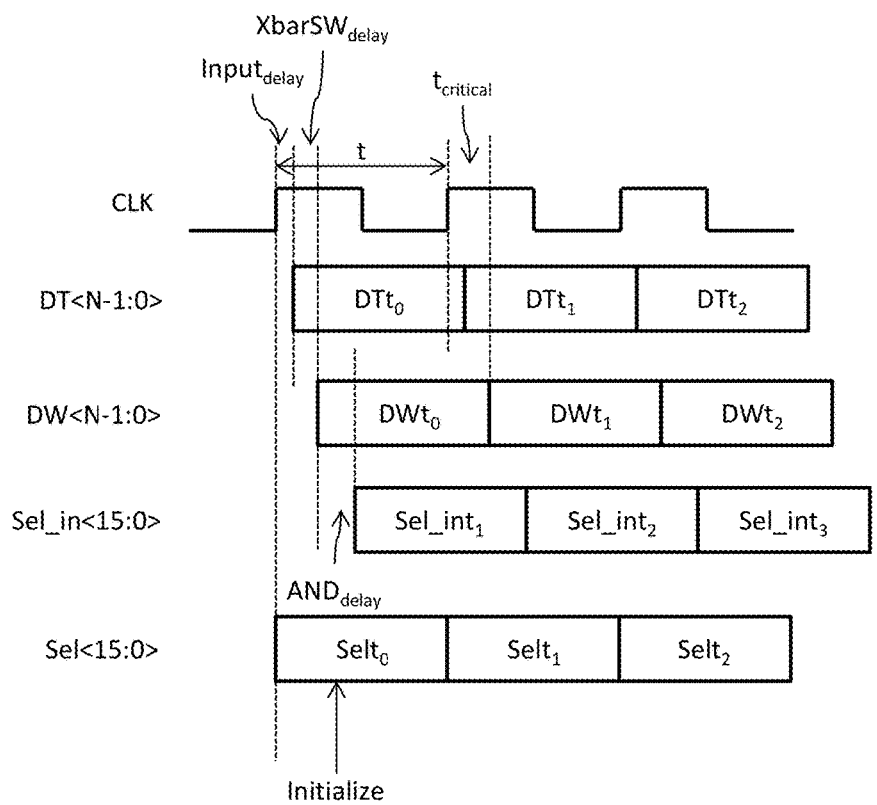
FIG. 6 is a timing diagram for operation of the DWA circuit of FIG. 3.

Operation of the DWA circuit 200 is driven by the data clock signal CLK. Reference is now made to FIG. 6 which shows a timing diagram illustrating that operation. Operation occurs relative to time cycles t of the data clock signal CLK. The DWA circuit 200 receives the multi-bit input data word DT<N-1:0> in the current time cycle $t_i$ and uses a multi-bit selection signal Sel<N-1:0> available in that current time cycle $t_i$ to output the multi-bit output data word DW<N-1:0> for that time cycle $t_i$. The multi-bit selection signal Sel<N-1:0> in the current time cycle $t_i$ is generated from the multi-bit output data word DW<N-1:0> generated in the previous time cycle $t_{i-1}$. This operation may be better understood through the consideration the circuit 200 operation over a plurality of consecutive time cycles.

At the beginning of circuit 200 operation, the multi-bit selection signal Sel<N-1:0> for the current time cycle $t_0$ (i.e., $Selt_0$) may be initialized to a desired value, such as the value <0,0, . . . ,0,0,1>. In this example case, k=0 because bit Sel(0) is logic 1. Such an initialization is needed because there is no multi-bit output data word DW<N-1:0> from the previous time cycle $t_{i-1}$ to use to generate the multi-bit selection signal Sel<N-1:0> for the current time cycle $t_0$.

The crossbar switch matrix 204 responds to the multi-bit selection signal Sel<N-1:0> with the initialized value of <0,0, . . . ,0,0,1> by connecting DT(0) to the output DW(0), DT(1) to the output DW(1), . . . , DT(N-2) to the output DW(N-2), and DT(N-1) to the output DW(N-1). For a multi-bit input data word DT<N-1:0> having a value of <0,0,0, . . . ,0,1,1,1> (i.e., the thermometric code for the data word having the value of 3, binary <0,1,1>) that is received in time cycle $t_0$, the circuit 200 will output a multi-bit output data word DW<N-1:0> (i.e., $DTt_0$) having a value of <0,0,0, . . . ,0,1,1,1> for time cycle $t_0$. The three logic 1 value bits of the multi-bit input data word DT<N-1:0> DWA convert to the multi-bit output data word DW<N-1:0> where the bit location of the beginning logic transition is at bit DW(0) and the bit location of the ending logic transition is at bit DW(2).

Assume now that the multi-bit input data word DT<N-1:0> received at time cycle $t_1$ (i.e., $DTt_1$) has a value of <0,0, . . . ,1,1,1,1,1> (i.e., the thermometric code for the data word having the value of 6, binary <1,1,0>). The DWA control circuit 210 processes the multi-bit output data word DW<N-1:0> having a value of <0,0,0, . . . ,0,1,1,1> from the previous time cycle $t_0$ (i.e., $DWt_0$) to identify the highest significant bit having a logic 1 value (i.e., the location of the ending logic transition). In this case, that would be bit DW(2) which is found by AND gate 350(3) whose first input receives logically inverted bit DW(3) and whose second input receives bit DW(2). The multi-bit selection input signal Sel_in<N-1:0> is thus generated for time cycle $t_1$ (i.e., Sel_int$_i$). In response to the load clock signal LD_CLK (generated from the data clock signal CLK by clock gate circuit C-GATE), the flip-flops 304 are loaded with the outputs of the AND gates 350. Only the flip-flop 304(3) coupled to the output of AND gate 350(3) will be set to a logic 1 value. The generated multi-bit selection signal Sel<N-1:0> will accordingly have a value of <0,0, . . . ,1,0,0,0> for the time period $t_1$ (i.e., Selt$_i$). Thus, k=3 because bit Sel(3) is logic 1. The crossbar switch matrix 204 responds to the multi-bit selection signal Sel<N-1:0> with the value of <0,0, . . . ,1,0,0,0> by connecting DT(13) to the output DW(0), DT(14) to the output DW(1), . . . , DT(11) to the output DW(N-2), and DT(12) to the output DW(N-1). The circuit 200 will output the multi-bit output data word DW<N-1:0> having a value of <0,0,0, . . . ,0,1,1,1,1,1,1,0,0,0> for time period $t_1$ (i.e., $DWt_1$) The six logic 1 value bits of the multi-bit input data word DT<N-1:0> thus DWA convert to the multi-bit output data word DW<N-1:0> where the bit location of the beginning logic transition is at bit DW(3) and the bit location of the ending logic transition is at bit DW(8).

Let's say that the multi-bit input data word DT<N-1:0> received at time cycle $t_2$ has a value of <1,1,1, . . . ,1,1,1,1,1,1> (i.e., all bits at a logic 1 value). The DWA control circuit 210 processes the multi-bit output data word DW<N-1:0> having a value of <0,0,0, . . . ,0,1,1,1,1,1,1,0,0,0> from the previous time cycle $t_1$ to identify the highest significant bit having a logic 1 value (i.e., the location of the ending logic transition). In this case, that would be bit DW(8) which is found by AND gate 350(9) whose first input receives logically inverted bit DW(9) and whose second input receives bit DW(8). The multi-bit selection input signal Sel_in<N-1:0> is thus generated for time cycle $t_2$ (i.e., Sel_int$_2$). In response to the load clock signal LD_CLK (generated from the data clock signal CLK by clock gate circuit C-GATE), the flip-flops 304 are loaded with the outputs of the AND gates 350. Only the flip-flop 304(9) coupled to the output of AND gate 350(9) will be set to a logic 1 value. The generated multi-bit selection signal Sel<N−1:0> will accordingly have a value of <0,0, . . . ,0,1,0,0,0,0,0,0,0,0> for time cycle $t_2$ (Selt$_2$). Thus, k=9 because bit Sel(9) is logic 1. The crossbar switch matrix 204 responds to the multi-bit selection signal Sel<N−1:0> with the value of <0,0, . . . ,0,1,0,0,0,0,0,0,0,0> by connecting DT(7) to the output DW(0), DT(8) to the output DW(1), . . . , DT(5) to the output DW(N−2), and DT(6) to the output DW(N−1). The circuit 200 will output the multi-bit output data word DW<N−1:0> (i.e., DWt$_2$) having a value of <1,1,1, . . . ,1,1,1,1,1,1> (i.e., all bits at a logic 1 value) in time cycle $t_2$. The sixteen logic 1 value bits of the multi-bit input data word DT<N−1:0> thus DWA convert to the multi-bit output data word DW<N−1:0> where the bit location of the beginning logic transition is at bit DW(9) and the bit location of the ending logic transition is at bit DW(8).

At this point in time, the NAND gate 312 of the clock generation circuit 300 detects the <1,1,1, . . . ,1,1,1,1,1,1> (i.e., all bits at a logic 1 value) input condition for the multi-bit input data word DT<N−1:0> and generates a signal 314 with a logic 0 value causing the clock gate circuit C-GATE to be disabled. The data clock signal CLK is not passed through and the load clock signal LD_CLK will not present an edge to trigger operation of the flip-flops 304 in the next time cycle $t_3$.

Consider now that the multi-bit input data word DT<N−1:0> received at time cycle $t_3$ has a value of <0,0,0, . . . ,0,0,0,1> (i.e., the thermometric code for the data word having the value of 1, binary <0,0,1>). The DWA control circuit 210 processes the multi-bit output data word DW<N−1:0> having a value of <1,1,1, . . . ,1,1,1,1,1,1> (i.e., all bits at a logic 1 value) from the previous time cycle t2 to identify the highest significant bit having a logic 1 value (i.e., the location of the ending logic transition). In this case, no such bit exists because all bits have a logic 1 value. All flip-flops 304 will output a logic 0 value, which would cause an incorrect operation of the switch matrix. This is of no concern, however, to the operation of the control circuit 212 in generating the multi-bit selection signal Sel<N−1:0> in the current time cycle $t_3$. The reason for this is that clock gate circuit C-GATE is currently disabled for the time cycle $t_3$, and so there is no operation performed to load the flip-flops 304 with new values. The flip-flops 304 instead retain the previous multi-bit selection signal Sel<N−1:0> with a value of <0,0, . . . ,0,1,0,0,0,0,0,0,0,0> indicative of the location of the ending logic transition from the previous time cycle $t_2$. Thus, k=9 because bit Sel(9) is logic 1. The crossbar switch matrix 204 responds to the multi-bit selection signal Sel<N−1:0> with the value of <0,0, . . . ,0,1,0,0,0,0,0,0,0,0> by connecting DT(7) to the output DW(0), DT(8) to the output DW(1), . . . , DT(5) to the output DW(N−2), and DT(6) to the output DW(N−1). The circuit 200 will output the multi-bit output data word DW<N−1:0> (i.e., DWt$_3$) having a value of <0,0, . . . ,0,1,0,0,0,0,0,0,0,0> for time cycle $t_3$. The one logic 1 value bit of the multi-bit input data word DT<N−1:0> thus DWA converts to the multi-bit output data word DW<N−1:0> where the bit location of the beginning logic transition is at bit DW(9) and the bit location of the ending logic transition is also at bit DW(9).

As shown herein, the AND logic 350 functions as a type of edge detector that will detect a transition in data input from 1 to 0 (not 0 to 1) which occurs at the bit location of the beginning logic transition. As an input having all logic 1 values or all logic 0 values does not present such a bit transition, the output from the AND logic 350 will be all logic 0 under such conditions. If this is not detected and blocked, this output would lead to a deselection of all switches in the crossbar. In order to handle this scenario, the LD_CLK is disabled for in respect to detection of the all logic 1 or all logic 0 input and the previous state of the selection signal Sel is maintained.

Let's now consider operation at a later point in time where the multi-bit output data word DW<N−1:0> has a value of <0,0,1,1,1,1, . . . ,0,0,0> for the previous time cycle $t_{i-1}$. Assume that the multi-bit input data word DT<N−1:0> received at the current time cycle $t_i$ has a value of <0,0, . . . ,0,1,1,1,1> (i.e., the thermometric code for the data word having the value of 4, binary <1,0,0>). The DWA control circuit 210 processes the multi-bit output data word DW<N−1:0> having a value of <0,0,1,1,1,1, . . . ,0,0,0> from the previous time cycle $t_{i-1}$ to identify the highest significant bit having a logic 1 value (i.e., the location of the ending logic transition). In this case, that would be bit DW(N−3), or bit DW(13) where N=16, which is found by AND gate 350(14) whose first input receives logically inverted bit DW(14) and whose second input receives bit DW(13). The multi-bit selection input signal Sel_in<N−1:0> is thus generated for current time cycle $t_i$ (i.e., Sel_int$_i$). In response to the load clock signal LD_CLK (generated from the data clock signal CLK by clock gate circuit C-GATE), the flip-flops 304 are loaded with the outputs of the AND gates 350. Only the flip-flop 304(14) coupled to the output of AND gate 350(14) will be set to a logic 1 value. The generated multi-bit selection signal Sel<N−1:0> will accordingly have a value of <0,1,0, . . . ,0,0,0,0>. Thus, k=14 because bit Sel(14) is logic 1. The crossbar switch matrix 204 responds to the multi-bit selection signal Sel<N−1:0> with the value of <0,1,0, . . . ,0,0,0,0> by connecting DT(2) to the output DW(0), DT(3) to the output DW(1), . . . , DT(0) to the output DW(N−2), and DT(1) to the output DW(N−1). The circuit 200 will output the multi-bit output data word DW<N−1:0> (i.e., DWt$_i$) having a value of <1,1,0, . . . ,0,0,0,0,0,1,1> for the current time cycle $t_i$. The four logic 1 value bits of the multi-bit input data word DT<N−1:0> thus DWA convert to the multi-bit output data word DW<N−1:0> where the bit location of the beginning logic transition is at bit DW(14) and wrapping around to end at the bit location of the ending logic transition at bit DW(1).

As another example of operation of the circuit 200 with N=16, consider the following values for the multi-bit input data word DT<15:0>, multi-bit output data word DW<15:0> and multi-bit selection signal Sel<15:0> over a time period from $t_0$ to $t_6$:

multi-bit input data word DT<15:0>
$t_0$: 0000000000000111
$t_1$: 0000000111111111
$t_2$: 0000000000000011
$t_3$: 0000000001111111
$t_4$: 1111111111111111
$t_5$: 0000000000001111
multi-bit output data word DW<15:0>
$t_{init}$: 0000000000000000
$t_0$: 0000000000000111
$t_1$: 0000111111111000
$t_2$: 0011000000000000
$t_3$: 1100000000011111
$t_4$: 1111111111111111 select will be held by this value
$t_5$: 0000000111100000
multi-bit selection signal Sel<15:0>
$t_0$: 0000000000000001 select is initialized
$t_1$: 0000000000001000
$t_2$: 0001000000000000
$t_3$: 0100000000000000

$t_4$: 0000000000100000
$t_5$: 0000000000100000 select is held from $t_4$
$t_6$: 0000001000000000

It will be noted that at time $t_{init}$, the multi-bit output data word DW<15:0> has no value and for time cycle $t_0$ the multi-bit selection signal Sel<15:0> has been initialized with a starting value for the DWA conversion of k=0. The multi-bit input data word DT<15:0> at time cycle $t_0$ has a thermometer code value of <0000000000000111> and with k=0 the crossbar switch matrix 204 in controlled to map the multi-bit input data word DT<15:0> value of <0000000000000111> to multi-bit output data word DW<15:0> having a value of <0000000000000111> at time cycle $t_1$.

This multi-bit output data word DW<15:0> at time $t_0$ produces a multi-bit selection signal Sel<15:0> with a value of <0000000000001000> at time $t_1$ and k=3. The multi-bit input data word DT<15:0> at time $t_1$ has a thermometer code value of <0000000111111111> and with k=3 the crossbar switch matrix 204 in controlled to map the multi-bit input data word DT<15:0> value of <0000000111111111> to multi-bit output data word DW<15:0> having a value of <0000111111111000> at time $t_1$.

This multi-bit output data word DW<15:0> at time $t_1$ produces a multi-bit selection signal Sel<15:0> with a value of <0001000000000000> at time $t_2$ and k=12. The multi-bit input data word DT<15:0> at time $t_2$ has a thermometer code value of <0000000000000011> and with k=12 the crossbar switch matrix 204 in controlled to map the multi-bit input data word DT<15:0> value of <0000000000000011> to multi-bit output data word DW<15:0> having a value of <0011000000000000> at time $t_2$.

This multi-bit output data word DW<15:0> at time $t_2$ produces a multi-bit selection signal Sel<15:0> with a value of <0100000000000000> at time $t_3$ and k=14. The multi-bit input data word DT<15:0> at time $t_3$ has a thermometer code value of <0000000001111111> and with k=14 the crossbar switch matrix 204 in controlled to map the multi-bit input data word DT<15:0> value of <0000000001111111> to multi-bit output data word DW<15:0> having a value of <1100000000011111> at time $t_3$. Note the wraparound of the bits.

This multi-bit output data word DW<15:0> at time $t_3$ produces a multi-bit selection signal Sel<15:0> with a value of <0000000000100000> at time $t_4$ and k=5. The multi-bit input data word DT<15:0> at time $t_4$ has a thermometer code value of <1111111111111111> and with k=5 the crossbar switch matrix 204 in controlled to map the multi-bit input data word DT<15:0> value of <1111111111111111> to multi-bit output data word DW<15:0> having a value of <1111111111111111> at time $t_4$.

This multi-bit output data word DW<15:0> with a value of <1111111111111111> at time $t_4$ is detected by the clock generation circuit 300 which responds by disabling the clock gate circuit C-GATE. The data clock signal CLK is accordingly blocked from passing through. In the absence of the load clock signal LD_CLK, the multi-bit output data word DW<15:0> with a value of <1111111111111111> at time $t_4$ will not cause any change in the multi-bit selection signal Sel<15:0> which is held at the value of <0000000000100000> at time $t_5$ and k=5. The multi-bit input data word DT<15:0> at time $t_5$ has a thermometer code value of <0000000000001111> and with k=5 the crossbar switch matrix 204 in controlled to map the multi-bit input data word DT<15:0> value of <0000000000001111> to multi-bit output data word DW<15:0> having a value of <0000000111100000> at time $t_5$.

The multi-bit output data word DW<15:0> having with the value of <0000000111100000> at time $t_5$ produces a multi-bit selection signal Sel<15:0> with a value of <0100000000000000> at time $t_6$ and k=9.

Reference is once again made to FIG. 6 for an examination of the timing relationships.

The reference to an "Input$_{delay}$" refers to a delay from the external data source that is providing the thermometer data DT. This is some finite time for data to arrive at the circuit 200 with respect to the timing of the data clock. There is not an instantaneous timing relationship between the edge of the data clock and presentation of the thermometer data DT.

The reference to XbarSW$_{delay}$ refers to a delay between data input to the crossbar switch and data output from the crossbar switch. This delay is both visible and consequential when the selection of crossbar switches is stable. Such conditions arise only for first data input-output (post initialization at $t_0$ only) and in cases when all bits of the input are logic 1 or logic 0. At other times, the selection signal Sel will not be stable and will be part of critical path.

The reference to $t_{critical}$ refers to the functional critical path of design (but not during initialization and not when bits are all logic 1 or all logic 0) which comprises the clock to flip-flop Q output delay of the flip-flops 304 plus the selection to output delay of the crossbar switch.

The reference to AND$_{delay}$ refers to a delay for the data weighted averaging output to in response to the selection Sel_in signal. Basically, this is the delay associated with the operation of the AND logic circuit. It can be appreciated that this delay is not part of critical path as its value is stable at current output and stable much before the subsequent clock rising edge. Sel_in will be loaded onto the flip-flops 304 in the subsequent cycle.

The waveforms in FIG. 6 along with the illustrated timing relationships thus show that the DWA outputs are available within a short span of time of presentation of inputs. This small conversion time can be attributed primarily to the clock to Q delay of the flip-flops and the selection to output delay of crossbar switch. Although the output computation directly involves processing by logic 350 and circuit 300 (clock gating logic), these tasks are excluded from the timing critical path by virtue of the proposed architecture.

Figure 1:
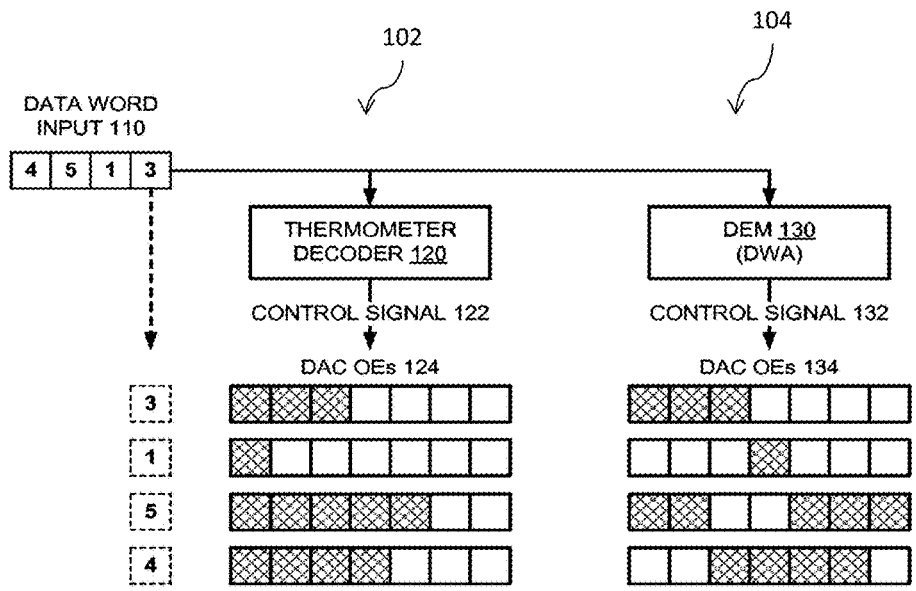
FIG. 1 compares the operation of a data converter that does not employ a data weighted averaging (DWA) algorithm and a data converter that does employ DWA.
Figure 2:
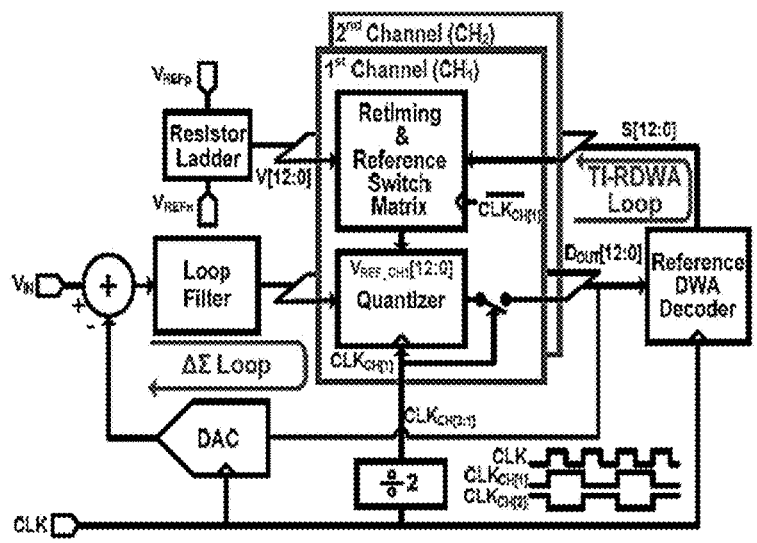
FIG. 2 shows a block diagram of a continuous time sigma-delta modulator using a time interleaved reference DWA architecture as known in the prior art.

Thus, FIG. 6 shows that the circuit 200 advantageously has a very low computational delay. Operation of the circuit 200 up to a data rate of multi-GHz is possible. The architecture of the circuit further mitigates the need for a decoder circuit and adder circuit, and thus is a distinct improvement over prior art designs such as that shown in FIG. 2. The architecture of the circuit 200 is further well suited for use in high speed feedback and feedforward topologies (for example, in circuits such as a feedback DAC in a sigma-delta analog-to-digital converter and a feed forward path of a high speed DAC). The regular and modular construction presented by the switch matrix, logical AND circuit and flip-flops of the circuit 200 allows for a fast implementation. Additionally, this circuit design advantageously operates with relatively low power and occupies a relatively small area, especially in comparison to prior art designs such as that shown in FIG. 2.

Figure 7:
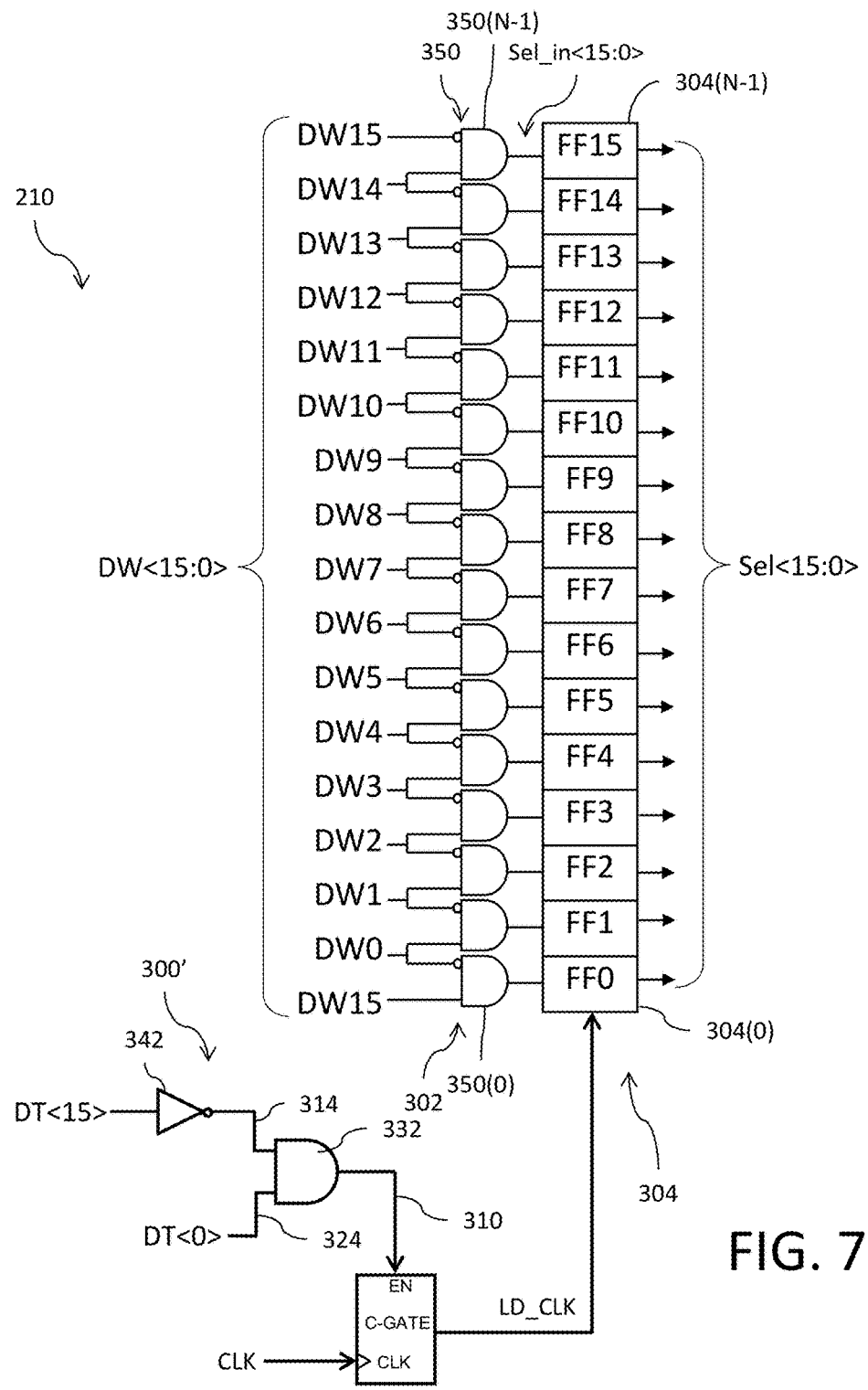
FIG. 7 is a circuit diagram for an alternative embodiment of the DWA control circuit as used in the DWA circuit of FIG. 3.

Reference is now made to FIG. 7 showing a circuit diagram for an alternative embodiment of the DWA control circuit 210. The circuit of FIG. 7 differs from the circuit of FIG. 5 only in the configuration of the clock generation circuit 300'. The logical NAND gate 312 is replaced by a single logical NOT gate 342 coupled to receive the most significant bit of the multi-bit input data word DT<N-1:0> from data bus 202, with the output of the NOT gate 342 coupled to one input of the AND gate 332. Furthermore, the logical OR gate 322 is eliminated and the second input of the AND gate 332 is coupled to receive the least significant bit of the multi-bit input data word DT<N−1:0> from data bus 202. The enable signal 310 generated at the output of the AND gate 332 is applied to the enable input (EN) of the clock gate circuit (C-GATE). The clock gate circuit (C-GATE) further includes a clock input that receives the data clock signal CLK.

The clock generation circuit 300' takes advantage of the following properties of a thermometric code: a) the most significant bit is high only when all bits of the thermometric code are high; and b) the least significant bit is low only when all bits of the thermometric code are low. Thus, the logic values of the most significant bit and least significant bit provide single bit indicators of whether all bits of the multi-bit input data word DT<N−1:0> are logic 1 or logic 0. In response to either the most significant bit being logic high or the least significant bit being logic low, the enable signal 310 is deasserted, and the clock gate circuit does not pass the data clock signal CLK through as the load clock signal LD_CLK, so that the flip-flops 340(0) to 304(N−1) are not triggered. In all other cases, the enable signal 310 is asserted and the clock gate circuit operates to pass the data clock signal CLK through as the load clock signal LD_CLK, so that the flip-flops 340(0) to 304(N−1) are triggered.

Although the preceding description has been described herein with reference to particular circuits and embodiments, it is not intended to be limited to the particulars disclosed herein; rather, it extends to all functionally equivalent structures, methods, and uses, such as are within the scope of the appended claims.

The invention claimed is:

1. A circuit for generating a data weighted averaging signal from a thermometric code signal, comprising:
    a crossbar switch matrix having an input configured to receive the thermometric code signal and an output configured to output the data weighted averaging signal, wherein switching between the input and output by the crossbar switch matrix is controlled by a crossbar selection signal, and
    a data weighted averaging control circuit configured to generate the crossbar selection signal, comprising:
        a first logic circuit configured to determine from bits of the data weighted averaging signal a bit location where an ending logic transition occurs;
        a load circuit configured to selectively load the bit location as the crossbar selection signal in response to assertion of a load signal; and
        a load control circuit configured to inhibit assertion of the load signal if all bits of the thermometric code signal are either logic 0 or logic 1.

2. The circuit of claim 1, wherein the load control circuit comprises:
    a gate circuit having an input receiving a clock signal and an enable input receiving an enable signal, the gate circuit configured to pass the clock signal as the load signal if the enable signal is asserted; and
    a test circuit configured to detect whether all bits of the thermometric code signal are either logic 0 or logic 1 and in response thereto deassert the enable signal.

3. The circuit of claim 2, wherein the test circuit comprises:
    a second logic circuit configured to test for all bits of the thermometric code signal being logic 0,
    a third logic circuit configured to test for all bits of the thermometric code signal being logic 1; and
    a fourth logic circuit configured to logically combine output from the second and third logic circuits to generate the enable signal.

4. The circuit of claim 2, wherein the test circuit comprises:
    a second logic circuit configured to logically combine a first single bit indicative of whether all bits of the thermometric code signal are logic 0 with a second single bit indicative of whether all bits of the thermometric code signal are logic 1 to generate the enable signal.

5. The circuit of claim 4, wherein the first single bit is a least significant bit of the thermometric code signal and the second single bit is a logical inversion of a most significant bit of the thermometric code signal.

6. The circuit of claim 4, further comprising:
    a logical OR gate configured to logically combine all bits of the thermometric code signal to generate the first single bit; and
    a logical NAND gate configured to logically combine all bits of the thermometric code signal to generate the second single bit.

7. The circuit of claim 1, wherein the first logic circuit comprises a plurality of AND gates, each AND gate having a first input coupled to receive one bit of the data weighted averaging signal and a second input coupled to receive another bit of the data weighted averaging signal, wherein said one bit and said another bit are adjacent bits within the data weighted averaging signal.

8. The circuit of claim 1, wherein the load circuit is a data storage circuit that stores the selection input signal in response to assertion of the load signal and outputs the crossbar selection signal.

9. The circuit of claim 1, wherein the thermometric code signal includes a plurality of bits and wherein the data weighted averaging signal includes a plurality of bits, said crossbar switch matrix operating to selectively connect the bits of the thermometric code signal to the bits of the data weighted averaging signal in a sequence having a barrel shifted position specified by the crossbar selection signal.

10. The circuit of claim 9, wherein the barrel shifted position places the bit location for the beginning logic transition for a current time cycle of the data weighted averaging signal adjacent to the bit location for the ending logic transition for a previous time cycle of the data weighted averaging signal.

11. A method, comprising:
    converting a thermometric code signal to a data weighted averaging signal using a crossbar switch matrix controlled by a crossbar selection signal;
    determining from bits of the data weighted averaging signal an ending bit location in the data weighted averaging signal where an ending logic transition occurs;
    selectively loading the bit location as the crossbar selection signal in response to assertion of a load signal; and
    inhibiting assertion of the load signal if all bits of the thermometric code signal are either logic 0 or logic 1.

12. The method of claim 11, further comprising:
    selectively passing a clock signal as the load signal in response to assertion of an enable signal;
    detecting whether all bits of the thermometric code signal are either logic 0 or logic 1; and
    in response thereto, deasserting the enable signal.

13. The method of claim 12, wherein detecting comprises logically combining all bits of the thermometric code signal.

14. The method of claim 12, wherein detecting comprises logically combining a first single bit indicative of whether all bits of the thermometric code signal are logic 0 with a second single bit indicative of whether all bits of the thermometric code signal are logic 1 to generate the enable signal.

15. The method of claim 14, wherein the first single bit is a least significant bit of the thermometric code signal and the second single bit is a logical inversion of a most significant bit of the thermometric code signal.

16. The method of claim 14, further comprising:
logically ORing all bits of the thermometric code signal to generate the first single bit; and
logically NANDing all bits of the thermometric code signal to generate the second single bit.

17. The method of claim 11, wherein selectively loading comprises storing the selection input signal in response to assertion of the load signal and outputting the crossbar selection signal.

\* \* \* \* \*